(12) United States Patent
Tiziani et al.

(10) Patent No.: US 11,557,547 B2
(45) Date of Patent: Jan. 17, 2023

(54) LEADFRAME FOR SEMICONDUCTOR DEVICES, CORRESPONDING SEMICONDUCTOR PRODUCT AND METHOD

(71) Applicant: STMicroelectronics S.r.l., Agrate Brianza (IT)

(72) Inventors: Roberto Tiziani, Nerviano (IT); Mauro Mazzola, Calvenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/126,880

(22) Filed: Dec. 18, 2020

(65) Prior Publication Data

US 2021/0193591 A1   Jun. 24, 2021

(30) Foreign Application Priority Data

Dec. 20, 2019   (IT) .................. 102019000025009

(51) Int. Cl.
| | | |
|---|---|---|
| *H01L 23/00* | (2006.01) | |
| *H01L 21/48* | (2006.01) | |
| *H01L 21/56* | (2006.01) | |
| *H01L 23/31* | (2006.01) | |
| *H01L 23/495* | (2006.01) | |

(52) U.S. Cl.
CPC ........ *H01L 23/562* (2013.01); *H01L 21/4825* (2013.01); *H01L 21/4828* (2013.01); *H01L 21/565* (2013.01); *H01L 23/3114* (2013.01); *H01L 23/4952* (2013.01); *H01L 23/49503* (2013.01); *H01L 23/49548* (2013.01)

(58) Field of Classification Search
CPC .............. H01L 23/562; H01L 23/3114; H01L 23/49503; H01L 23/4952; H01L 23/49548; H01L 21/4825; H01L 21/4828; H01L 21/565
See application file for complete search history.

(56) References Cited

U.S. PATENT DOCUMENTS

| | | |
|---|---|---|
| 7,732,914 B1 | 6/2010 | McLellan et al. |
| 2002/0117740 A1 | 8/2002 | Jang et al. |
| 2005/0199986 A1 | 9/2005 | Ma et al. |

(Continued)

FOREIGN PATENT DOCUMENTS

| | | |
|---|---|---|
| JP | H01278757 A | 11/1989 |
| JP | H043450 A | 1/1992 |
| JP | 2001044351 A | 2/2001 |

OTHER PUBLICATIONS

IT Search Report and Written Opinion for IT Appl. No. 102019000025009 dated Aug. 21, 2020 (9 pages).

(Continued)

*Primary Examiner* — Marc Anthony Armand
(74) *Attorney, Agent, or Firm* — Crowe & Dunlevy

(57) ABSTRACT

A leadframe for semiconductor devices, the leadframe comprising a die pad portion having a first planar die-mounting surface and a second planar surface opposed the first surface, the first surface and the second surface having facing peripheral rims jointly defining a peripheral outline of the die pad wherein the die pad comprises at least one package molding compound receiving cavity opening at the periphery of said first planar surface.

22 Claims, 3 Drawing Sheets

(56) References Cited

U.S. PATENT DOCUMENTS

| | | | |
|---|---|---|---|
| 2006/0255438 A1* | 11/2006 | Omori | H01L 21/565 |
| | | | 257/676 |
| 2007/0052070 A1 | 3/2007 | Islam et al. | |
| 2007/0111379 A1 | 5/2007 | Shim et al. | |
| 2012/0241947 A1* | 9/2012 | Camacho | H01L 23/49582 |
| | | | 257/737 |
| 2017/0033056 A1 | 2/2017 | Kasuya et al. | |
| 2020/0135632 A1 | 4/2020 | Mishra et al. | |

OTHER PUBLICATIONS

EP Search Report and Written Opinion for co-pending EP Appl. No. 20214010.9 dated May 7, 2021 (9 pages).

\* cited by examiner

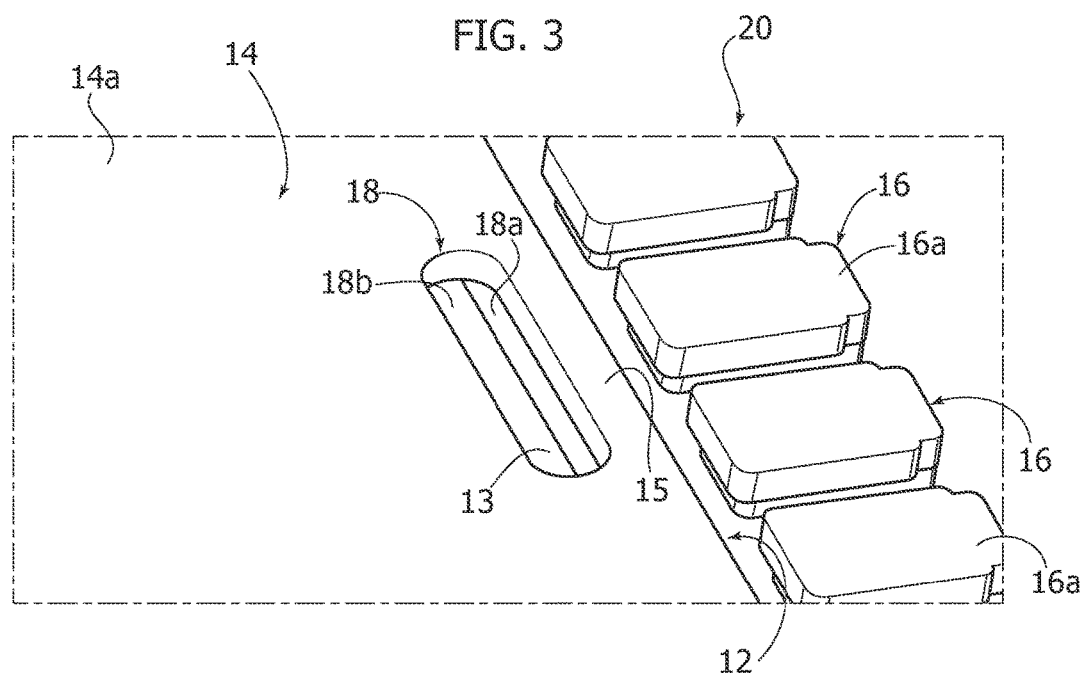
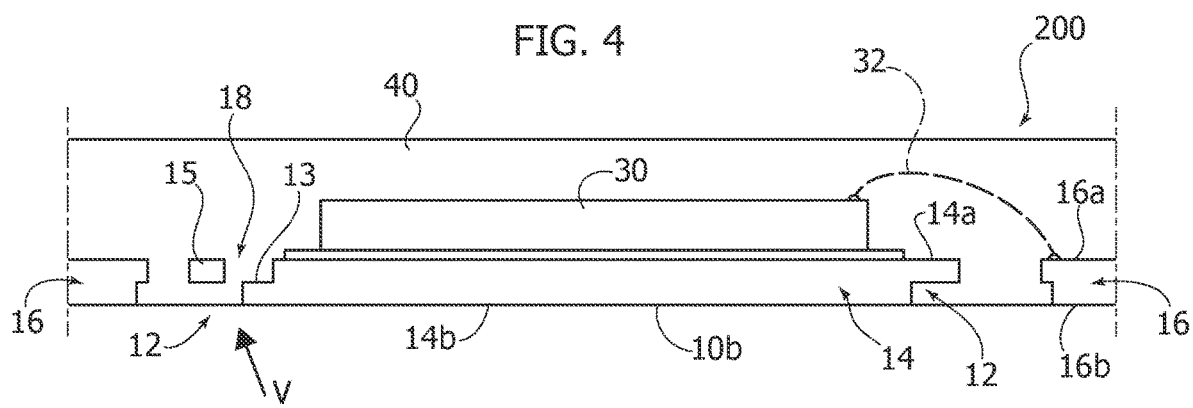
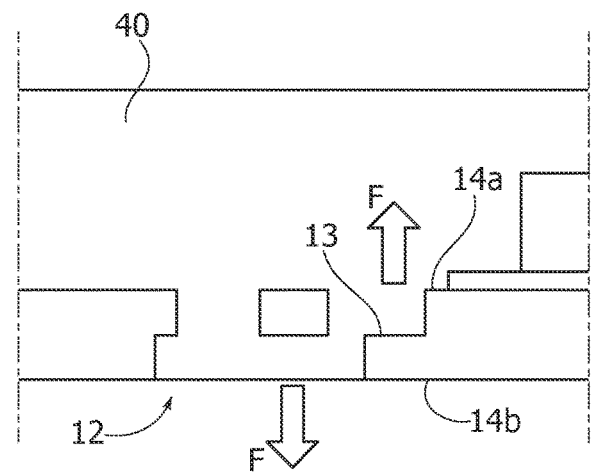

LEADFRAME FOR SEMICONDUCTOR DEVICES, CORRESPONDING SEMICONDUCTOR PRODUCT AND METHOD

PRIORITY CLAIM

This application claims the priority benefit of Italian Application for Patent No. 102019000025009, filed on Dec. 20, 2019, the content of which is hereby incorporated by reference in its entirety to the maximum extent allowable by law.

TECHNICAL FIELD

The description relates to integrated circuits (ICs) manufacturing technology.

One or more embodiments may be applied, in particular, to Quad-Flat No-leads (QFN) or Quad-Flat Package (QFP) exposed pad (QFN-ep, QFP-ep) semiconductor packaging having exposed leads on the bottom of the package body thereof, and to a method of manufacturing thereof.

One or more embodiments may be applied to a pre-molded leadframe which is molded in a flat configuration and is adapted for use in package applications using surface mount technology (SMT).

BACKGROUND

IC dies are conventionally enclosed in plastic packages providing protection from the environment and facilitating electrical interconnection between the IC die and an underlying substrate such as a printed circuit board (PCB).

In a conventional arrangement, a packaged semiconductor device may include: a metal leadframe; at least one integrated circuit die; material to attach the integrated circuit die to a die pad in the leadframe; bond wires which electrically connect pads on the IC die to individual leads of the leadframe; and a hard plastic encapsulant material, for instance a molding compound plastic resin, which covers the other components and forms the exterior of the package.

The leadframe is the central supporting structure for the IC die, in particular during assembly of such a packaged semiconductor device, is adopted to shape external contactors (leads or pads). A portion of the leadframe may be completely surrounded by the plastic encapsulant. Portions of the leads of the leadframe extend externally from the package or are partially exposed within the encapsulant material for use in electrically connecting the package to another component. In certain packaged semiconductor devices, a portion of the die pad of the leadframe may also remain exposed within the exterior of the package for use as a heat sink.

One type of semiconductor package commonly known in the electronics field is referred to as a quad flat pack (QFP) package. A QFP package may comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is mounted to a die pad of the QFP package leadframe. In certain types of QFP packages referred to as QFP exposed pad (QFP-ep) packages, one surface of the die pad is exposed within the bottom surface of the package body.

A package may be stressed during reliability evaluation and the adhesion between all the parts can be ascertained for determining package reliability. The leadframe adhesion on the resin is an important figure of merit for the package hermeticity and its reliability.

In QFN, QFP package technology external contactors (leads or pads) can be shaped by photoetching and, as mentioned, a die pad portion of the leadframe sustaining the IC die silicon chip may be exposed to the exterior of the molded body.

In that respect, adhesion/strength is an issue, particularly with a pre-molded leadframe and/or when using ribbon bonding (for high-power applications, for instance).

A molding compound shrinking on a die paddle may result in a compressive stress likely to produce a so-called "crying" warpage leading to resin detachment from the leadframe due to lack of adhesion, that is to delamination between the molding compound and the die pad. Die pad/molding delamination can jeopardize package hermeticity, as the die pad may be pulled out from the molded body when mounted on PCB.

Existing solutions available to leadframe suppliers in order to improve reliability of resin-die pad coupling may comprise surface treatments to the die pad or tailored under (photo) etching of the leadframe.

Reliability tests performed on such arrangements indicate, however, that delamination between mold compound and under etch die pad can still take place, with the resulting gap compromising package hermeticity.

There is a need in the art to contribute in providing improved solutions addressing the issues discussed in the foregoing.

SUMMARY

One or more embodiments relate to a system/device/circuit/method.

One or more embodiments facilitate an improved anchorage of the die pad to the molding compound by providing trough slot on the die pad periphery, formed by over-lapping of upper and lower half-cut patterns.

One or more embodiments may relate to a corresponding leadframe.

A leadframe comprising a die pad having a slot formation on one side and a stepped profile outline may be exemplary of such a leadframe.

One or more embodiments may relate to a corresponding semiconductor assembly.

One or more embodiments may relate to a corresponding method.

A method of manufacturing a leadframe or a semiconductor assembly having improved resilience to delamination may be exemplary of such a method.

In one or more embodiments, may facilitate providing QFP-ep packages with improved package hermeticity and delamination reduced (virtually removed).

In one or more embodiments, a feature may be included to the die pad area of the leadframe to increase its adhesion to subsequently applied molding compound. Such a feature may comprise a half etch done on an upper side of the die pad, the half etch overlapping partially a second half etch on the bottom of the die pad.

One or more embodiments may relate to a corresponding leadframe.

One or more embodiments may create a resin under lock that may facilitate preventing delamination on die pad and increasing die pad hermeticity in the semiconductor assembly.

In one or more embodiments, such a trough slot perforating partially a half-etched area on die pad periphery may facilitate creating a strong locking by mold compound, preventing a die pad pulling out from the molded body when mounted on a Printed Circuit Board (PCB).

One or more embodiments may be suited for use in QFN and QFP-ep semiconductor packages with photoetched leadframe.

In one or more embodiments, the die pad may be designed so as to comprise one or more engraved slots on one surface.

One or more embodiments may advantageously facilitate, among others: reducing or avoiding delamination between molding compound resin and die pad; improving die pad locking in both direction during assembly of a (pre-)molded QFN leadframe; providing an alternative to the surface treatments; and providing an under-etch feature on photo-etched lead frames.

The claims are an integral part of the technical teaching provided herein with reference to the embodiments.

BRIEF DESCRIPTION OF THE DRAWINGS

One or more embodiments will now be described, by way of non-limiting example only, with reference to the annexed Figures, wherein:

FIG. 3 is a partial perspective view of a leadframe of one or more embodiments seen from the front or top side thereof;

FIG. 4 is a partial cross-sectional view of a leadframe of one or more embodiments;

FIG. 5 is a view of a portion of FIG. 4 indicated by arrow V reproduced on an enlarged scale and showing possible effects of embodiments;

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

The drawings are in simplified form and are not to precise scale. For the sake of simplicity, directional (up/down, etc.) or motional (forward/back, etc.) terms may be used with respect to the drawings. The term "couple" and similar terms do not necessarily denote direct and immediate connections, but also include connections through intermediate elements or devices.

As mentioned, improving locking between the leadframe and molding compound is an object of one or more embodiments as per the present disclosure.

Figure 1:
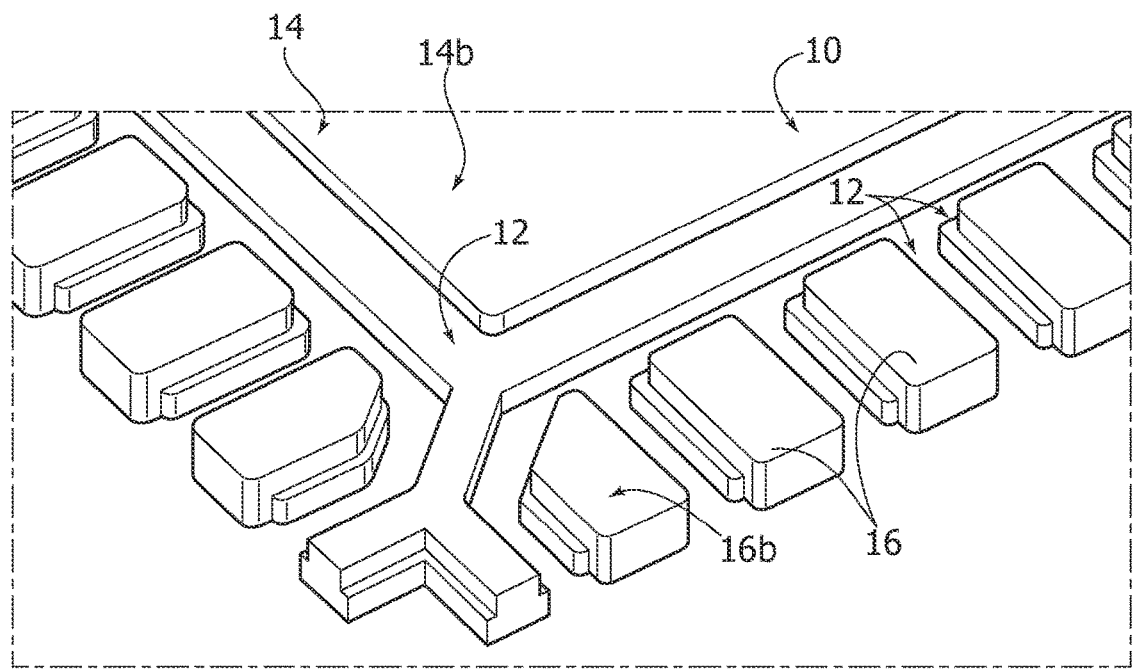
FIG. 1 is a partial perspective view of a leadframe seen from the back or bottom side thereof.
Figure 2A:
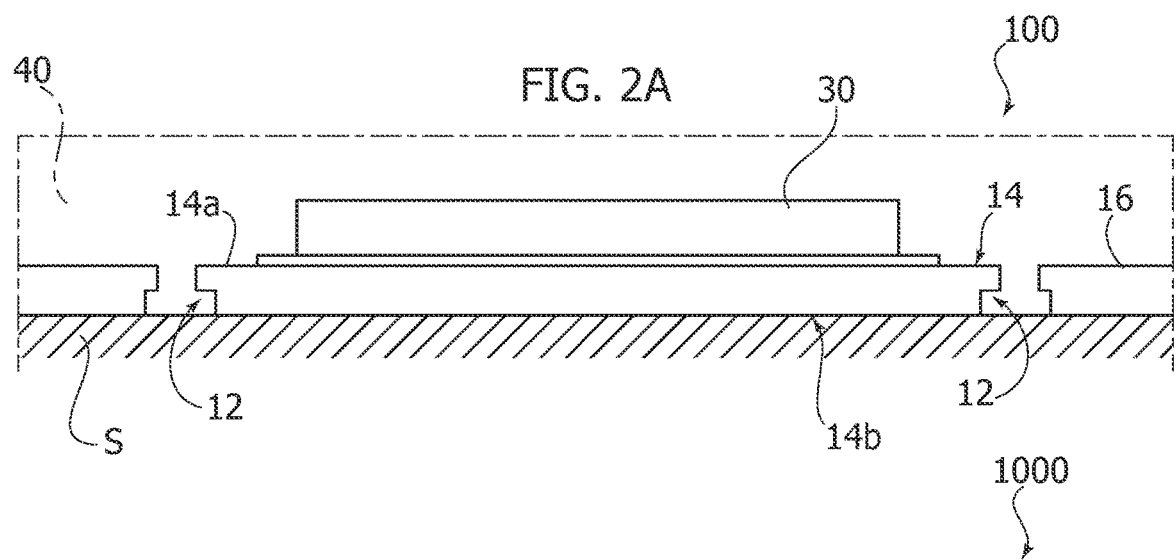
FIGS. 2A and 2B are exemplary of possible use of a leadframe as exemplified in FIG. 1.
Figure 2B:
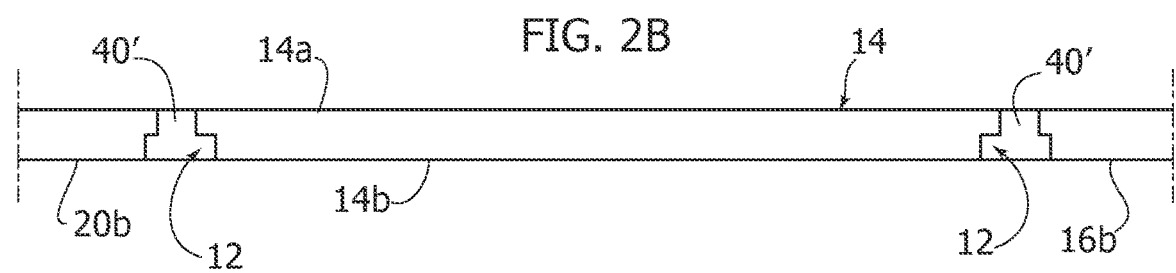

In order to facilitate an improved locking, some solutions may comprise methods of under-etching the leadframe so as to form an inverted T-shape during an operation of half-cut etching of the leadframe, as exemplified in FIG. 1, FIG. 2A and FIG. 2B.

FIG. 1 is a perspective view of a portion of a (metallic, for instance copper) lead-frame 10 subjected to back-etching as discussed in the following, the lead-frame 10 comprising an array of electrical contact formations 16 around a die pad portion.

In one or more embodiments, the array of electrical contact formations 16 may possibly have selectively plated parts provided thereon by known means.

As mentioned, the leadframe 10 may have a core or die pad area 14 configured to host a semiconductor die.

Specifically, the die pad 14 may comprise a first planar die-mounting surface and a second planar surface 14b opposed the first planar die-mounting surface.

For instance, the semiconductor die may be glued onto such first planar die-mounting surface (not visible in FIG. 1) and the electrical contact formations 16 may be configured to provide electrical connection and accessibility to the semiconductor die functions once placed on the die pad area 14 of the leadframe 10.

In one or more embodiments the die pad 14 may have a polygonal shape, for instance square, and may comprise a generally planar top surface and an opposed, generally planar, bottom surface, as well as four peripheral edge segments.

As a result of the etching processing, for instance, a stepped profile 12 may be engraved in the die pad rim or outline as well as in the rim or outline of the leads 16 of the leadframe.

Specifically, such a photoetching process may be configured to provide a half-etched leadframe 10 wherein the stepped profile 12 comprises a first step and a second step, the first step having a half-width with respect to the width of the leadframe before etching.

As mentioned, during the formation of the leadframe 10 via etching processing, also the leads 16 may be half-etched in a manner facilitating the formation of a continuous, recessed shoulder within the surface thereof, such shoulder extending continuously along the inner end and portions of the longitudinal sides of each lead 16.

An assembly 100 of the leadframe 10 and a semiconductor die 30 may have a transverse section as exemplified in FIG. 2A, wherein the semiconductor die (or dice) may be placed on a first surface 14a of the die pad 14 of the leadframe 10.

Subsequent to the mechanical and electrical connection of the semiconductor die 30 to the electrical contact formations 16, for instance via through the use of the conductive wires (known as wire bonding, not visible in the Figures), the assembly 100 may be encapsulated or covered with an encapsulant material in a molding process, with the hardening of the encapsulant material resulting in the formation of a package body of the semiconductor package 100. The encapsulant material is applied to the leadframe 10 such that in the completely formed package body, the bottom surface 14b of the die pad 14 and the "bottom" surfaces 16b (opposed to respective "top" surfaces 16a) of the electrical contact formations 16 may be exposed within a "bottom" surface of the package assembly 100, wherein the bottom surface of the package assembly 100 may be configured to be coupled to a support S. In one or more embodiments, for instance, such a support S may comprise a Printed Circuit Board, briefly PCB.

For instance, the leadframe 10 may be assembled as a pre-molded leadframe 1000 as exemplified in FIG. 2B, for instance having spaces between die pad 14 and leads 16 filled with a molding compound 40', wherein the second surface 14b of the die pad 14 and a top surface 16b of the electrical contact formations 16 may remain visible to external inspection.

As mentioned, the packaged semiconductor device 100 or pre-molded leadframe 1000 may have an improved resistance to delamination forces which may cause a deterioration of adhesion between molding and leadframe.

Specifically, such an improved resistance may result thanks to the presence of the stepped profile outline or recessed shoulder 12 sculptured into the die pad rim, which may counter delamination forces acting parallel to the die pad planar surface 14a.

Nevertheless, such a shoulder 12 may hardly contribute to countering forces acting in other directions, for instance perpendicularly to the die-pad surface. Lack of protection from such (non-parallel) forces may cause in any case a deterioration of adhesion between molding and the leadframe: for instance, the leadframe may tend to "slip" outside of its seat as a result of such forces.

One or more embodiments as per the present disclosure aim at providing such an improved adhesion between the leadframe die pad 14 and molding compound 40 with respect to delamination forces acting in any direction.

In one or more embodiments as exemplified in FIG. 3 such an improvement may be facilitated via a die-pad 14 of a leadframe 20 comprising at least one engraved formation 18, for instance having an oval shape or a mouth portion, going through a first step in a stepped profile 12 outlining the die pad 14. This engraved formation 18 includes one part 18a which extends completely through the die pad 14 and another part 18b which extends only partially through the die pad 14 to define a bottom face or step 13.

The leadframe 20 may be formed from rolled strip metal stock by wet chemical etching or mechanical stamping using progressive dies. Photo Chemical etching (also known as chemical milling) is a process that uses photolithography and metal-dissolving chemicals to etch a pattern into a metal strip. The photoresist is exposed to ultraviolet light through a photo mask having a desired pattern, and is subsequently developed and cured. Chemicals are sprayed or otherwise applied to the masked strip, and exposed portions of the strip are etched away, leaving the desired pattern.

As mentioned, the lead frame 20 can be formed by photo-etching or chemically etching the rolled strip metal stock from both sides using a conventional liquid etchant. The etch process may be stopped early so as to provide an under-etching of various surfaces of the lead frame 20 to achieve the desired cross-sectional configuration, for instance as exemplified in FIGS. 2A and/or 2B or in FIG. 7.

Figure 7:
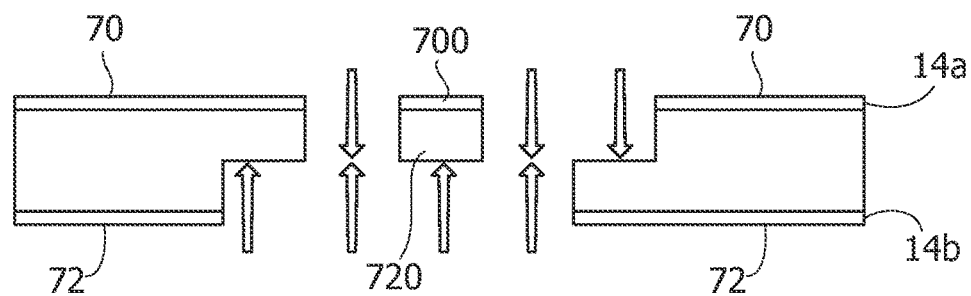
FIG. 7 is an exemplary diagram of principles underlying embodiments.

Specifically, in one or more embodiments as exemplified in FIG. 7, different masked strips may be used for different sides of the leadframe. For instance, a first mask 70 may be used to etch, for instance with a first etching flow from top 700, the top surface 14a to form a first etched part extending into the front die-mounting leadframe surface and only partially through the leadframe and a second mask 72 may be used to etch, for instance with a second etching flow from bottom 720, the bottom surface 14b to form a second etched part extending into the back leadframe surface and only partially through the leadframe. In one or more embodiments, applying such a differentiated etching processing 700, 720 may facilitate obtaining different (engraving) patterns on different leadframe surfaces 14a, 14b and thus define the cavity 18.

FIG. 4 is exemplary of a section of one or more embodiments of an assembly 200 of the leadframe 20 and a semiconductor die 30 packaged with an encapsulating molding compound 40. For instance, the semiconductor die 30 may be coupled to the second surface or "top" surface 14a of the die pad 14 and may be coupled to contact formations 16 via (wire-bonded) contacts 32.

FIG. 5 is an enlarged view of a portion V of FIG. 4. In one or more embodiments as exemplified in FIG. 5, thanks to the presence of formation 18 which goes through the stepped profile 12 of the die pad 14, the molding compound when poured is coupled to the die pad 14 via an anchoring portion 15 of the die pad 14 which is a result of the engraved formation 18 filled with the molding compound. The anchoring 15 may be of various sizes and ratios with respect to the die pad surface 14a as a function of the size of the steps in the rim, for instance of a first step 13 in the stepped profile 12 of the die pad 14.

In one or more embodiments as exemplified in FIG. 3, the formation 18 may have the shape of an oval slot, such a shape being purely exemplary and in no way limiting. For instance, the formation 18 may have other polygonal shapes or comprise a pattern of, e.g. parallel, oval or polygonal formations.

Figure 6:
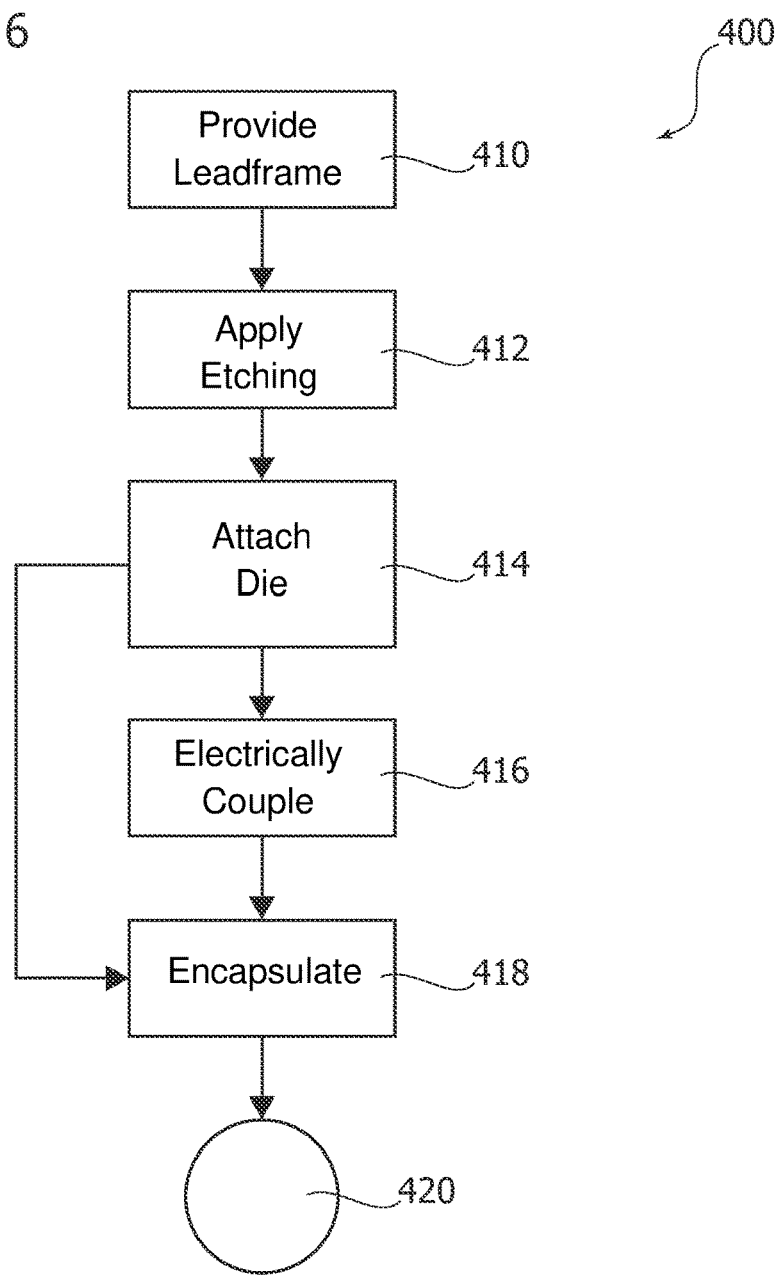
FIG. 6 is a flow chart exemplary of possible acts in embodiments.

In one or more embodiments as exemplified in FIG. 6, a method 400 of manufacturing a pre-molded leadframe and/or a semiconductor device as per the present disclosure may comprise:

providing 410 a (metallic, for instance copper) leadframe, the leadframe 10 comprising a die pad 14 and a plurality of leads 16;

applying under-etching 412, e.g. photo etching or chemical etching, to a first side 14b, 16b of the leadframe 10, so as to impart a step profile to the outline of the die pad 14 and, mirror symmetrically, the outline of leads in the plurality of leads 16, the stepped profile comprising a first step and a second step;

applying etching processing 412, e.g. photo or chemical etching, to a second side 14a, 16a of the leadframe, specifically to a second surface 14a of the die pad area 14 in the leadframe so as to etch at least one formation and/or a pattern of formations, going through the first step in the stepped profile 12 outlining the die pad 14;

coupling 414 a semiconductor die to the second die pad surface 14a of the die pad 14;

electrically coupling 416 the semiconductor die 30 to the electrical contact formations 16 in the leadframe, for instance via wire bonding 32; and applying a molding compound 418 filling a volume comprising at least said leadframe 10 and in a way so that a second die pad surface 14b opposed said first die pad surface 14a of the die pad is exposed to the outside and wherein the at least one formation 18 etched in the die pad 14 is filled with said molding compound 40.

As a result, the method 400 may comprise providing 420 at least one of a semiconductor device 200 and/or a pre-molded leadframe 2000 having an improved robustness with respect to delamination forces acting in any direction.

One or more embodiments relate to a leadframe (for instance, 10) for semiconductor devices which may comprise a die pad portion (for instance, 14) having a first planar die-mounting surface (for instance, 14*a*) and a second planar surface (for instance, 14*b*) opposed the first surface, the first surface (for instance, 14*a*) and the second surface (for instance, 14*b*) having facing peripheral rims jointly defining a peripheral outline of the die pad, wherein the die pad comprises at least one package molding compound receiving cavity (for instance, 18) opening at the periphery of said first planar surface.

In one or more embodiments, said at least one package molding compound receiving cavity may comprise a through cavity (for instance, 18) extending from said first planar surface to said second planar surface.

In one or more embodiments, said at least one package molding compound receiving cavity may have a mouth portion at said first planar surface, said mouth portion having a closed contour and being at a distance from the peripheral rim of the first planar surface.

In one or more embodiments, the peripheral rims said first surface and said second surface may be mutually offset to provide a stepped peripheral outline of the die pad with the periphery of said first planar surface having a peripheral region protruding with respect to the second planar surface, wherein said at least one package molding compound receiving cavity is provided at said protruding region of the first planar surface.

In one or more embodiments, said at least one package molding compound receiving cavity may comprise a buttonhole-like cavity.

In one or more embodiments, the leadframe may comprise a plurality of said package molding compound receiving cavities (for instance, 15, 18) distributed along the peripheral outline of the die pad.

In one or more embodiments, the leadframe may have package molding compound (for instance, 40') molded thereon flush with said first planar die-mounting surface and said second planar surface, the package molding compound (for instance, 40) filling said at least one package molding compound receiving cavity opening at the periphery of said first planar surface.

One or more embodiments may relate to a semiconductor product (for instance, 200), comprising: a leadframe (for instance, 10) according to one or more embodiments; and at least one semiconductor die (for instance, 30) coupled to said first planar surface (for instance, 14*a*) in the die pad (for instance, 14) of the leadframe.

In one or more embodiments, the semiconductor product may comprise: electrically-conductive formations (for instance, 32) electrically coupling said at least one semiconductor die with said leadframe; and/or package molding compound (for instance, 40) encapsulating said at least one semiconductor die coupled to said first planar surface in the die pad of the leadframe.

One or more embodiments may relate to a method which may comprise: providing (for instance, 410) a leadframe (for instance, 10) for semiconductor devices, the leadframe comprising a die pad portion (for instance, 14) having a first planar die-mounting surface (for instance, 14*a*) and a second planar surface (for instance, 14*b*) opposed the first surface; applying etching processing (for instance, 412), preferably photo-etching processing, to said first surface and said second surface, the first surface and the second surface having facing peripheral rims jointly defining a peripheral outline of the die pad, wherein the die pad comprises at least one package molding compound receiving cavity (for instance, 15, 18) opening at the periphery of said first planar surface.

In one or more embodiments, the method may comprise: coupling (for instance, 414) at least one semiconductor die (for instance, 30) to said first planar surface in the die pad of the leadframe.

In one or more embodiments, the method may comprise: electrically coupling said at least one semiconductor die with said leadframe; and/or encapsulating (for instance, 40) said at least one semiconductor die coupled to said first planar surface in the die pad of the leadframe.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

Without prejudice to the underlying principles, the details and embodiments may vary, even significantly, with respect to what has been described by way of example only, without departing from the extent of protection. The extent of protection is defined by the annexed claims.

The invention claimed is:

1. A leadframe for semiconductor devices, comprising:
a die pad having a first planar die-mounting surface and a second planar surface opposite the first planar die-mounting surface, the first planar die-mounting surface and the second planar surface having facing peripheral rims jointly defining a peripheral outline of the die pad; and
at least one cavity extending through the die pad from said first planar die-mounting surface to said second planar surface to define an anchoring portion of the die pad positioned between said at least one cavity and the peripheral outline;
wherein said at least one cavity comprises:
a first etched part extending into the first planar die-mounting surface to a first depth less than a thickness of the die pad; and
a second etched part extending into the second planar surface to a second depth less than the thickness of the die pad;
wherein a bottom of said first etched part defines a step surface within the at least one cavity that extends parallel to the first planar die-mounting surface and the second etched part defines a thickness of the anchoring portion which is less than the thickness of the die pad.

2. The leadframe of claim 1, wherein each cavity is configured for receiving a package molding compound.

3. The leadframe of claim 1, wherein said first etched part of the at least one cavity defines a mouth portion at said first planar die-mounting surface, said mouth portion having a closed contour and being at a distance from the peripheral rim of the first planar die-mounting surface.

4. The leadframe of claim 1, wherein the peripheral rims said first planar die-mounting surface and said second planar surface are mutually offset to provide a stepped peripheral outline of the die pad with a periphery of said first planar die-mounting surface having a peripheral region protruding with respect to the second planar surface, wherein said at least one cavity is provided at said protruding peripheral region of the first planar die-mounting surface.

5. The leadframe of claim 1, wherein said at least one cavity comprises a buttonhole-like cavity.

6. The leadframe of claim 1, where said at least one cavity comprises a plurality of cavities distributed along the peripheral outline of the die pad.

7. The leadframe of claim 1, further comprising a package molding compound molded on the leadframe flush with said first planar die-mounting surface and said second planar surface, the package molding compound filling said at least one cavity.

8. The leadframe of claim 1, wherein the first and second etched parts together form a portion of the at least one cavity which extends completely through the thickness of the die pad.

9. A semiconductor product, comprising:
a leadframe according to claim 1; and
at least one semiconductor die coupled to said first planar die-mounting surface in the die pad of the leadframe.

10. The semiconductor product of claim 9, comprising:
electrically-conductive formations electrically coupling said at least one semiconductor die with said leadframe.

11. The semiconductor product of claim 9, comprising:
package molding compound encapsulating said at least one semiconductor die coupled to said first planar die mounting surface in the die pad of the leadframe.

12. A leadframe for semiconductor devices, comprising:
a die pad having a first planar die-mounting surface and a second planar surface opposite the first surface, the first planar die-mounting surface and the second planar surface having facing peripheral rims jointly defining a peripheral outline of the die pad; and
at least one cavity extending through the die pad from said first planar die-mounting surface to said second planar surface to define an anchoring portion of the die pad positioned between said at least one cavity and the peripheral outline;
wherein said at least one cavity comprises:
a first opening extending into the first planar die-mounting surface; and
a second opening extending into the second planar surface;
wherein the first and second opening have depths such that the first and second openings connect to each other; and
wherein the first opening is offset from the second opening such that the connection between the first and second openings is smaller than each either of the first and second openings.

13. The leadframe of claim 12, wherein the depth of the first opening defines a step surface within the at least one cavity that extends parallel to the first planar die-mounting surface and wherein the depth of the second opening defines a thickness of the anchoring portion which is less than the thickness of the die pad.

14. The leadframe of claim 12, wherein the peripheral rims said first planar die-mounting surface and said second planar surface are mutually offset to provide a stepped peripheral outline of the die pad with a periphery of said first planar die-mounting surface having a peripheral region protruding with respect to the second planar surface, wherein said at least one cavity is provided at said protruding peripheral region of the first planar die-mounting surface.

15. The leadframe of claim 12, further comprising a package molding compound molded on the leadframe flush with said first planar die-mounting surface and said second planar surface, the package molding compound filling said at least one cavity.

16. A leadframe for semiconductor devices, comprising:
a die pad with a peripheral rim defining a peripheral outline of the die pad and having a first planar die-mounting surface and a second planar surface opposite the first planar die-mounting surface;
a cavity extending through the die pad from said first planar die-mounting surface to said second planar surface to define an anchoring portion of the die pad at said first planar die-mounting surface positioned between said at least one cavity and the peripheral outline;
wherein said cavity comprises:
a first etched part extending into the die pad from the first planar die-mounting surface to a first depth less than a thickness of the die pad;
wherein a bottom of said first etched part defines a step surface within the cavity that is opposite the second planar surface of the die pad; and
a second etched part extending into the die pad from the second planar surface to a second depth less than the thickness of the die pad;
wherein a bottom of said second etched part defines a rear surface of the anchoring portion that is opposite the first planar die-mounting surface of the die pad.

17. The leadframe of claim 16, wherein the cavity is filled with an insulating material.

18. The leadframe of claim 17, wherein the insulating material is flush with both the first planar die-mounting surface and the second planar surface.

19. The leadframe of claim 16, wherein said first etched part of the cavity is located at a distance from the peripheral rim and the second etched part of the cavity is located at the peripheral rim.

20. A semiconductor product, comprising:
a leadframe according to claim 16; and
at least one semiconductor die coupled to said first planar die-mounting surface in the die pad of the leadframe.

21. The semiconductor product of claim 20, comprising:
electrically-conductive formations electrically coupling said at least one semiconductor die with said leadframe.

22. The semiconductor product of claim 20, comprising:
package molding compound encapsulating said at least one semiconductor die coupled to said first planar die mounting surface in the die pad of the leadframe.

* * * * *